US006634005B1

(12) United States Patent
Lindsay et al.

(10) Patent No.: US 6,634,005 B1
(45) Date of Patent: Oct. 14, 2003

(54) SYSTEM AND METHOD FOR TESTING AN INTERFACE BETWEEN TWO DIGITAL INTEGRATED CIRCUITS

(75) Inventors: Dean T. Lindsay, Milpitas, CA (US);
John A. Benavides, Garland, TX (US);
Kenneth D. Holloway, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/563,763

(22) Filed: May 1, 2000

(51) Int. Cl.[7] .............................................. G01R 31/28
(52) U.S. Cl. ..................................................... 714/726
(58) Field of Search ................................ 714/726, 724, 714/729, 727, 742, 30

(56) References Cited

U.S. PATENT DOCUMENTS

| 5,321,277 A | * | 6/1994 | Sparks et al. ................. 257/48 |
| 5,732,091 A | * | 3/1998 | Whetsel ....................... 714/727 |
| 5,852,617 A | * | 12/1998 | Mote, Jr. ...................... 714/726 |
| 6,418,545 B1 | * | 7/2002 | Adusumilli ................. 714/729 |

OTHER PUBLICATIONS

IEEE Standard 1149.1b (1994) IEEE Standard Test Access Port and Boundary–Scan Architecture Mar. 1, 1995; pp 1–66.
Supplement to IEEE Standard 1149.1 (1990) IEEE Standard Test Access Port and Boundary–Scan Architecture Oct. 21, 1993.

* cited by examiner

Primary Examiner—Christine T. Tu

(57) ABSTRACT

A system and method for testing at least one interface of a digital integrated circuit while at least one other interface of the digital integrated circuit operates in a normal mode is disclosed. Each interface includes at least one boundary scan cell such that each boundary scan cell is electrically coupled to a pin of the digital integrated circuit. The method includes selectively categorizing at least one interface into a first category. At least one other interface is selectively categorized into a second category. A first mode signal is provided to the interfaces categorized into the test mode category such that the interfaces categorized into the test mode category operate in a test mode. A second mode signal is provided to the interfaces categorized into the normal operation mode category such that the interfaces categorized into the normal operation mode category operate in a normal operation mode.

15 Claims, 4 Drawing Sheets

| Instruction | Mode |
|---|---|
| Test Signal | 1 |
| Data Signal | 0 |

SYSTEM AND METHOD FOR TESTING AN INTERFACE BETWEEN TWO DIGITAL INTEGRATED CIRCUITS

THE FIELD OF THE INVENTION

The present invention relates generally to the testing of interfaces between digital integrated components, and more particularly, to testing one or more interfaces associated with a digital integrated circuit while at least one or more other interfaces associated with the digital integrated circuit continues to operate in a normal operation mode.

BACKGROUND OF THE INVENTION

The sophistication of a present-day electronic system is a result of complex functions handled by digital integrated circuits making up the electronic system. Digital integrated circuits comprise the majority of electronic circuits in computers and other digital electronic products. Digital integrated circuits can be configured, for example, as a central processing unit (CPU), a programmable logic array (PLA), an application specific integrated circuit (ASIC), or a digital signal processor (DSP). Both the sophistication and speed of operation of these digital integrated circuits have rapidly increased due to improvements in integrated circuit manufacturing technologies resulting in smaller and faster devices. Replacing electronic components, such as a digital integrated circuit within a computer or digital electronic product, has become a standard practice. In addition, upgrading a computer or digital electronic product by installing additional hardware, such as digital integrated circuits, has become standard practices.

Once a particular digital integrated circuit has been installed, either for replacement or upgrade purposes, it is important to ensure that the various interfaces of the digital integrated circuit are properly connected with other digital integrated circuits or electronic components. Two test methods are commonly used in the electronics industry to test the interface between two or more digital integrated circuits, which are used, for example, in a computer system. The first test method utilizes a functional test approach, in which the interface in question is exercised using a software program which forces the associated digital integrated circuits to interact via the interface being tested in a normal, standard manner. In other words, the normal interaction between the associated digital integrated circuits must be triggered. The functional test method has several disadvantages, in that the test is usually difficult to write, having unknown test coverage, and frequently disrupts the normal use of the interface and all integrated circuits on the interface. More specifically, the interface may be infrequently used or may only be used in an error situation. Also, the interface may facilitate a destructive occurrence. Thus, the software program will override the normal function of the interface such that the interface provides a signal which creates an undesireous or destructive result to the overall system.

The second common test method for testing the interface between two digital integrated circuits is a boundary scan method. This method is standardized by IEEE Standard 1149.1b (1994) IEEE Standard Test Access Port and Boundary Scan Architecture (supplement to IEEE Standard 1149.1 (1990) and IEEE Standard 1149.1a (1993)). The IEEE Standard 1149.1 (1990) and any past or future revisions, including the referenced revisions made in 1993 and 1994, are hereby incorporated by reference in their entirety. The boundary scan method, as standardized, is known in the art as the cornerstone for interface testing procedures in this field.

In the boundary scan method, all of the input pins (also called ports or pads) and output pins of a digital integrated circuit are placed under control of test software. Test patterns are driven over the one or more interfaces of the digital integrated circuit by a test software control via boundary scan cells interconnected between the logic and the pins of the digital integrated circuit. Such test patterns are easily machine generated having known test coverage. The test patterns are easily applied and the results easily evaluated. However, since all input and output pins are involved in the boundary scan test, they are not capable of normal operation. Thus, for the boundary scan test to be executed, all normal operation of the integrated circuit under the boundary scan test is stopped. This is an undesireous effect in that with the complex technology of integrated circuit designs, various integrated circuits are interconnected. Under the boundary scan test, all interfaces between the particular digital integrated circuit being tested and any other integrated circuit are overridden, and therefore not operating under normal conditions, but rather operating under test conditions. Thus, by testing the interfaces of a single digital integrated circuit, an entire network of digital integrated circuits may cease to operate under a normal mode, such that a test mode can be provided.

Therefore, there is a need for a testing system and method which can reliably test one or more interfaces of a digital integrated circuit, while permitting other interfaces of the digital integrated circuit to operate under normal conditions, such that when testing some of the interfaces of an integrated circuit, an entire network of interfaces between numerous integrated circuits is not inhibited.

SUMMARY OF THE INVENTION

The present invention provides a system and method for testing at least one interface of a digital integrated circuit while at least one other interface of the digital integrated circuit operates in a normal operation mode. Each interface has at least one boundary scan cell, each boundary scan cell electrically coupled to a pin of the digital integrated circuit. Each interface includes a mode input.

The method of the present invention includes selectively categorizing at least one interface into a first category. At least one other interface is selectively categorized into a second category. A first mode signal is provided to the interfaces categorized into the test mode category such that the interfaces categorized into the test mode category operate in a test mode. A second mode signal is provided to the interfaces categorized into the normal operation mode category such that the second set of boundary scan cells operates in the normal operation mode.

In one embodiment, the steps of selectively categorizing the first and second interfaces is further defined by a controller, such as a Test Access Port. This controller facilitates selectively categorizing a particular interface into one of the first or second categories. Additionally, the step of providing the first mode signal further includes providing a test mode signal to the interfaces categorized into the test mode category such that a first subset of the boundary scan cells within the interfaces categorized into the test mode category associated with an output pin of the digital integrated circuit provides a test output signal. In another embodiment of the invention, the method further includes providing a boundary scan signal to each boundary scan cell.

In yet another embodiment of the invention, a system is provided for testing at least one interface of a digital integrated circuit categorized into a test mode category while at least another interface of the digital integrated circuit categorized into a normal operation mode category operates in a normal operation mode. The system includes a plurality of boundary scan cells, each boundary scan cell electrically coupled to a pin of the digital integrated circuit. Each interface includes at least one boundary scan cell. A controller is electrically coupled to each interface and capable of providing either a test mode signal or a normal operation mode signal to each interface such that the boundary scan cells of the at least one interface operate in a test mode and the boundary scan cells of the at least one other interface operate in a normal operation mode.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
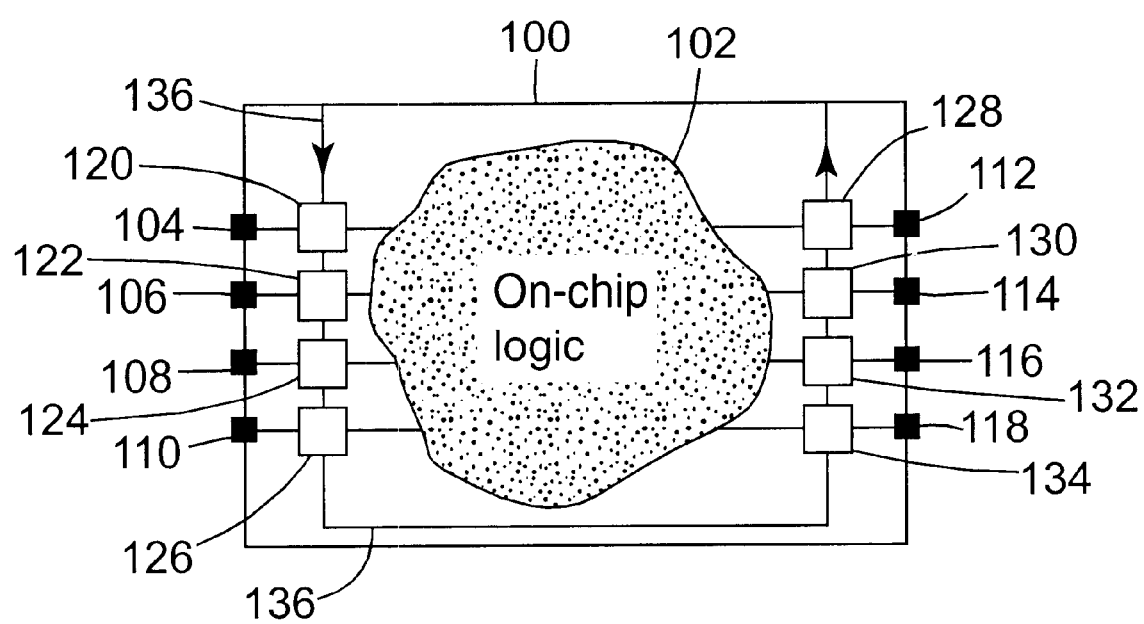
FIG. 1 is a simplified block diagram of a digital integrated circuit including boundary scan cells.

FIG. 1 is a basic block diagram of digital integrated circuit 100. Integrated circuit 100 includes on-chip logic 102, input pins 104, 106, 108, and 110, output pins 112, 114, 116, and 118, boundary scan cells 120, 122, 124, 126, 128, 130, 132, and 134, and boundary scan ring or serial test interconnect 136. As shown in FIG. 1, integrated circuit 100 includes four input pins and four output pins. However, it is understood that any number of input pins and output pins may be included on integrated circuit 100, depending upon the operational needs of integrated circuit 100, without deviating from the present invention. In addition, it is also understood that one or more pins may be a combined input/output pin, without deviating from the present invention. The number of pins are shown merely for illustration purposes.

When integrated circuit 100 is incorporated into an electronic system or computer, integrated circuit 100 may interconnect with one or more digital integrated circuits. For example, input pins 104, 106, 108, and 110 may all be electrically coupled to another integrated circuit. The connectors which interconnect input pins 104, 106, 108, and 110 to the outputs of another integrated circuit make up an interface between the two integrated circuits. Similarly, if two input pins, such as input pins 104 and 106, are electrically coupled to the output of a first integrated circuit, while input pins 108 and 110 are electrically coupled to an output of a third integrated circuit, two interfaces are included. One interface includes the connectors connecting input pins 104 and 106 to corresponding output pins of a second integrated circuit, while the other interface includes the connectors of input pins 108 and 110 to the outputs of third integrated circuit.

Once a particular digital integrated circuit, such as integrated circuit 100, has been installed, either for replacement or upgrade purposes, it is important to ensure that the various interfaces of the digital integrated circuit are properly connected with other digital integrated circuits or electronic components. Two test methods are commonly used in the electronics industry to test the interface between two or more digital integrated circuits, which are used, for example, in a computer system. The first test method utilizes a functional test approach, in which the interface in question is exercised by forcing the associated digital integrated circuits to interact via the interface being tested in a normal, standard manner. In other words, the normal interaction between the associated digital integrated circuits must be triggered. The functional test method has several disadvantages, in that the test is usually difficult to write, having unknown test coverage, and frequently disrupts the normal use of the interface and all integrated circuits on the interface. More specifically, the interface may be infrequently used or may only be used in an error situation. Also, the interface may facilitate a destructive occurrence. Thus, the test will override the normal function of the interface such that the interface provides a signal which creates an undesireous or destructive result to the overall system.

The second common test method for testing the interface between two digital integrated circuits is a boundary scan method. FIG. 1 illustrates a boundary scan method for verifying the interconnections between integrated circuit 100 and its interconnected integrated circuits. The boundary scan method is standardized by IEEE Standard 1149.1b (1994) IEEE Standard Test Access Port and Boundary-Scan Architecture (supplement IEEE Standard 1149.1b (1990) and IEEE Standard 1149.1a (1993)). IEEE Standard 1149.1b and any subsequent revisions are hereby incorporated by reference in their entirety. IEEE Standard 1149.1 is the cornerstone for testing the interfaces between a plurality of digital integrated circuits.

In a boundary scan method standardized by IEEE Standard 1149.1b (1994), all input and output pins of a digital integrated circuit, such as integrated circuit 100, are placed under control of test software test patterns are driven over the one or more interfaces by a test software control via boundary scan cells 120–134 interconnected between on-chip logic 102 and input/output pins 104–118, respectively. Such patterns are easily machine generated with known test coverage. The test patterns are easily applied and the results easily evaluated. However, since all input and output pins (104–118) are involved in the test, these pins are not available for any other use. Thus, all normal operation of integrated circuit 100 stops under a test situation.

Boundary scan cells 120–134 provide a scan shift-register stage adjacent to input pins 104, 106, 108, and 110 and output pins 112, 114, 116, and 118. Boundary scan cells 120–134 are coupled into a serial shift-register path around the periphery of integrated circuit 100, also called boundary scan ring 136.

Figure 2:
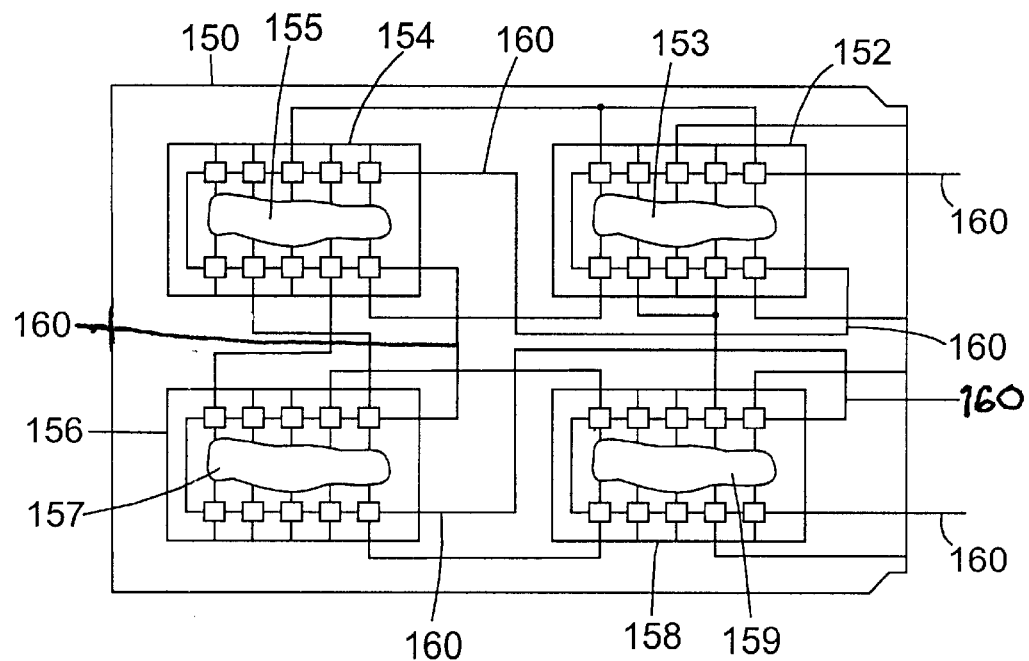
FIG. 2 is a simplified block diagram illustrating a plurality of interconnected digital integrated circuits.

FIG. 2 is a block diagram illustrating the use of IEEE Standard 1149.1b on digital integrated circuits 152, 154, 156, and 158 of printed circuit board 150. As shown in FIG. 2, each integrated circuit includes on-chip logic 153, 155, 157, and 159 and various input, output and combined input/output pins. A series of boundary scan cells, represented by square boxes, are positioned between each input pin and associated on-chip logic and each between output pin and associated on-chip logic of integrated circuits 152, 154, 156, and 158. The input pins, output pins, and boundary scan cells are not labeled in FIG. 2 for clarity purposes.

As shown in FIG. 2, boundary scan ring or serial test interconnect line 160 is interconnected with each boundary scan cell associated with integrated circuits 152–158 via a serial connection. In a normal operating mode, the boundary scan cells of integrated circuits 152–158 do not affect the transmission of information into or out of on-chip logics 153–159 associated with integrated circuits 152–158. Information "passes through" the boundary scan cells in a normal operation mode. However, in a test mode, each boundary scan cell prevents normal operation information from exiting the boundary scan cell. Instead, during a test mode, information which has been previously propagated in a serial format to all boundary scan cells associated with integrated circuits 152–158 via boundary scan ring 160 is passed to the associated output pin.

One example of testing the interfaces associated with integrated circuits 152–158 is to scan in a known logic series, such as a series of zeros, into the boundary scan cells associated with the output pins of each integrated circuit. The data which arrives at the boundary scan cells associated with the input pins is captured and then shifted out to external circuitry. It is understood that if a series of zeros is provided to the boundary scan cells associated with the output pins, then the associated boundary scan cells associated with the input pins to which they are connected should receive a series of zeros. Other useful data patterns may also be substituted for a series of ones or zeros without deviating from the present invention. A pattern of all ones or zeros is discussed therein for illustrative purposes. External circuitry analyzes the received information to determine if all zeros have been received. The external circuitry then repeats this process, substituting a series of ones for the series of zeros. After the shifting and capturing of data is complete, external circuitry will determine whether all interconnections are properly operating.

Figure 3:
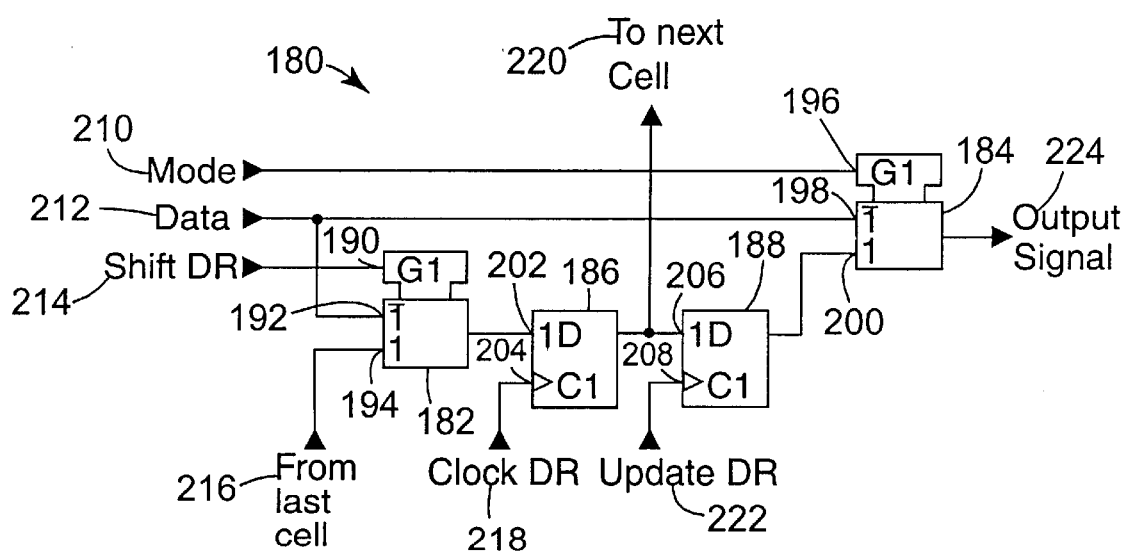
FIG. 3 is a circuit diagram illustrating one configuration of a single boundary scan cell.

FIG. 3 is a circuit diagram illustrating boundary scan cell 180 suitable for use on an output pin of an integrated circuit. Boundary scan cell 180 illustrates one embodiment of a boundary scan cell shown and described in IEEE Standard 1149.1b. However, IEEE Standard 1149.1b describes numerous boundary scan cell configurations. Thus, boundary scan cell 180 is shown in FIG. 3 for generally purposes only and should not be interpreted as a limitation of the present invention. Boundary scan cell 180 includes multiplexors 182 and 184 and flip-flops 186 and 188. Multiplexor 182 includes select input "gate" 190, first data input 192, and second data input 194, while multiplexor 184 includes select input "gate" 196, first data input 198, and second data input 200. Flip-flop 186, which is a flip-flop on the boundary scan ring, includes data input 202 and clock input 204, while flip-flop 188, which is the output data flip-flop for the boundary scan cell includes data input 206 and clock input 208.

As shown in FIG. 3, mode signal 210 is provided to select input 196 of multiplexor 184. Mode signal 210 indicates whether boundary scan cell 180 is operating in either a normal operation mode or a test mode. Data signal 212 is the signal transmitted through boundary scan cell 180 during a normal operation mode. Data signal 212 is directly provided to first data input 198 of multiplexor 184 and provided to first data input 192 of multiplexor 182. Test signal 216 is provided to second input 194 of multiplexor 182 from the previous output test signal from the previous boundary scan cell on boundary scan ring 160. Shift DR signal 214 is provided to select input 190 of multiplexor 182. Shift DR signal 214 provides the signal to multiplexor 182 which selects which data input to multiplexor 182 is supplied to input 202 of flip-flop 186, either from data signal 212 (capturing the output of on-chip logic) or signal 216 from the boundary scan ring from the last cell (shifting boundary scan ring 160). Clock DR 218 provides a clocking signal to flip-flop 186 via clock input 204. The output of flip-flop 186 is provided to the input of flip-flop 188 and is provided as output signal 220 to the boundary scan ring to the next cell. Update DR 222 provides a clock signal to flip-flop 188 via clock input 208. The output of flipflop 188 is provided to multiplexor 184 at second data input 200. Output signal 224 of multiplexor 184 is provided to an output pin associated with boundary scan cell 180.

Boundary scan cell 180, shown in FIG. 3, operates as follows. Mode signal 210 provides an input to select input 196 of multiplexor 184, which determines whether boundary scan cell 180 is in either a normal operation mode or a test mode. If mode signal 210 indicates a normal operation mode, data signal 212 from the on-chip logic, which is provided to first data input 198 of multiplexor 184, is provided as output signal 224. Output signal 224 is then provided to a corresponding output pin associated with boundary scan cell 180. Output signal 224 is then provided to an input pin of a second integrated circuit via an electrical connection of an interface. The signal is further input into a boundary scan cell associated with the input of the second integrated circuit, and from the boundary scan cell to the on-chip logic. Recovered normal operation data can also be read out of the boundary scan cell associated with the input pin of the second integrated circuit. In normal operation mode, the circuitry including multiplexor 182 and flip-flops 186 and 188 do not affect the transfer of the data signal through boundary scan cell 180.

To supply test data, the test data is first supplied serially to the input of boundary scan ring 160. Shift DR 214 is set, and clock DR 218 is operated repetitively until the data bit desired to be supplied to output signal 224 is stored in flip-flop 186. Then, update DR 222 is clocked once, storing the data value from flip-flop 186 into flip-flop 188.

In a test mode, mode signal 210 provides a signal to select input 196 of multiplexor 184 such that the input at second data input 200 is provided as output signal 224. Therefore, output signal 224 corresponds to the output of flip-flop 188. This output signal, which is a test signal, is forwarded to an output pin associated with boundary scan cell 180, which is further forwarded to an input pin of a second integrated circuit via an electrical connection of an interface. The signal is further input into a boundary scan cell associated with the input pin of the second integrated circuit. Recovered test data can then be read out of the boundary scan cell associated with the input pin of the other second circuit.

The boundary scan method described briefly above and standardized by IEEE Standard 1149.1b provides for testing of interfaces between digital integrated circuits. The test apparatus described in IEEE Standard 1149.1b allows for test patterns which are easily machine generated and have known test coverage. The test is easily applied and the results are easily evaluated. However, a major disadvantage with the IEEE Standard 1149.1b is that all input and output pins within an integrated design or system are involved in the test. Therefore, the entire system under test is not available for any other use. All normal use of the involved integrated circuits are halted under test conditions.

The present invention provides a modification to the apparatus described in IEEE Standard 1149.1b such that the input and output pins to be tested are selectable on an interface by interface basis. In other words, selected output pins are facilitating the propagation of test signals while other non-selected output pins are facilitating the propagation of normal operation signals. Therefore, the present invention segments the boundary scan ring into sections corresponding to the input and output pins for each separable interface on an integrated circuit. It also provides control to enable each separate interface to be selected for output from the boundary scan ring. Interfaces which are selected for output from the boundary scan ring propagate test signals. Interfaces which are not selected for output from the boundary scan ring continue propagating normal signals. This allows each interface to be separately tested using the IEEE Standard 1149.1b test method while the remainder of the integrated circuit can be utilized for its normal function in the overall digital system. Thus, an entire system is not "shut down" during a test procedure.

Figures 4, 5:
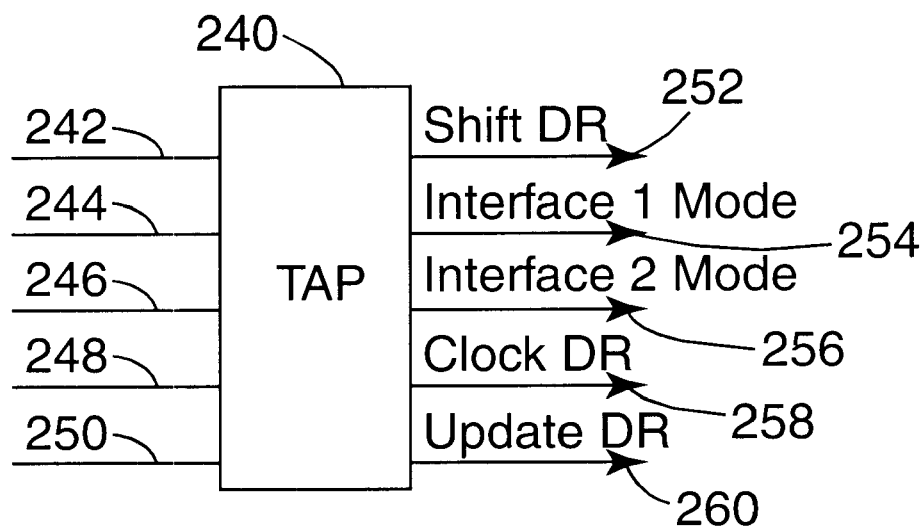
FIG. 4 is a simplified diagram illustrating the inputs and outputs of a controller used in conjunction with the present invention.
FIG. 5 is a chart illustrating the logic signals associated with a test mode and a normal operation mode of a boundary scan cell in accordance with the present invention.

FIG. 4 is an illustration of a controller having numerous inputs and numerous outputs. Controller 240 includes inputs 242, 244, 246, 248, and 250. In IEEE Standard 1149.1b, controller 240 is referred to as Test Access Port (TAP) and is defined by IEEE Standard 11491.b. IEEE Standard 1149.1b dictates the inputs for controller 240 to manipulate controller 240 into providing the desired outputs of the controller 240. Controller 240 further includes shift DR output signal 252, Interface 1mode signal 254, Interface 2 mode signal 256, clock DR output signal 258 and update DR output signal 260. The outputs of controller 240 used in conjunction with the present invention differ from the outputs of a controller associated with the basic boundary scan method disclosed in IEEE Standard 1149.1b in that controller 240 includes both Interface 1 mode signal 254 and Interface 2 mode signal 256. A controller associated with the boundary scan method disclosed in IEEE Standard 1149.1b includes only one mode signal which can be switched between a normal mode signal and a test mode signal. Utilizing two separate mode signals (254 and 256) provides the flexibility of the present invention to test one or more interfaces while permitting one or more other interfaces to continue providing normal operation signals.

FIG. 5 is a table illustrating the mode signal to be input into a specific boundary scan cell at the select input of a multiplexor, such as select input 196 of multiplexor 184 of boundary scan cell 180 shown in FIG. 3. If a logic 1 is applied to select input 196, output signal 224 corresponds to test data which has been shifted through the boundary scan chain to flip-flop 186 and then clocked to the output of flip-flop 188. Conversely, if the logic signal entering select input 196 of multiplexor 184 is a logic 0, output signal 224 corresponds to data signal 212.

Figure 6:
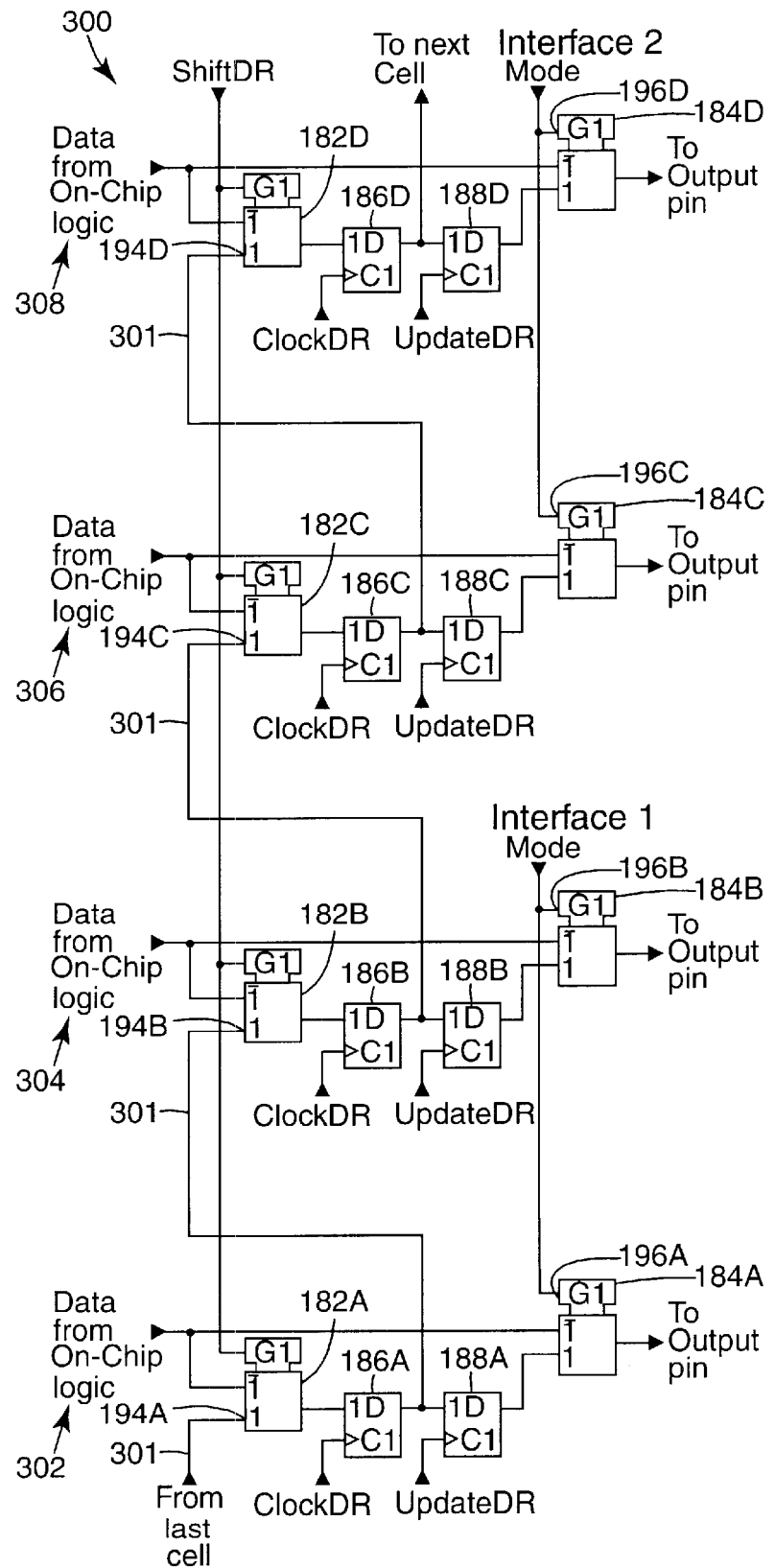
FIG. 6 is a circuit diagram illustrating the electrical configuration of a plurality of boundary scan cells in accordance with the present invention.

FIG. 6 is an electrical circuit diagram illustrating system 300. FIG. 6 illustrates the present invention. System 300 includes boundary scan cells 302, 304, 306, and 308. It is understood that while only four boundary scan cells are shown in FIG. 6, any number of boundary scan cells may be included in system 300 without deviating from the present invention. In addition, boundary scan cells 302, 304, 306, and 308 each illustrate one embodiment of a boundary scan cell shown and described in IEEE Standard 1149.1b. However, IEEE Standard 1149.1b describes numerous boundary scan cell configurations. Thus, boundary scan cell 302, 304, 306, and 308 are shown in FIG. 6 for general illustrative purposes only and should not be interpreted as a limitation of the present invention.

Each boundary scan cell shown in FIGS. 6 is similar to boundary scan cell 180 shown in FIG. 3. Therefore, similar elements have been labeled with identical reference numbers. However, the same mode input signal is not provided to each of select inputs 196A, 196B, 196C, and 196D of multiplexors 184A, 184B, 184C, and 184D. Rather, Interface 1 mode signal 254 (shown in FIG. 4) is supplied to gates 196A and 196B from TAP 240, while Interface 2 mode signal 256 (shown in FIG. 4) is supplied to gates 196C and 196D from TAP 240.

Boundary scan ring 301 is serially coupled to second data inputs 194A, 194B, 194C, and 194D of multiplexors 182A, 182B, 182C, and 182D. Boundary scan ring 301 is provided to boundary scan cell 302 from a serially connected boundary scan cell not shown in FIG. 6. Boundary scan ring 301 is provided from boundary scan cell 308 to another serially connected boundary scan cell not shown in FIG. 6. In addition, TAP 240, shown in FIG. 4 provides various inputs to system 300, such as shift DR signal 252, clock DR signal 258 and update DR signal 260.

Boundary scan cells 302 and 304 are associated with two output pins of a digital integrated circuit within a first interface, while boundary scan cells 306 and 308 are associated with two output pins of a second interface of the digital integrated circuit. Therefore, the output pins associated with boundary scan cells 302 and 304 could be providing a test signal to corresponding input signals of a second integrated circuit, at the same time that the output pins associated with boundary scan cells 306 and 308 will be providing a normal operation signal to input pins associated with a third integrated circuit. It is understood that two separate, distinguishable interfaces are necessary in order to utilize the present invention.

TAP 240, shown in FIG. 4, provide the various inputs to each of boundary scan cells 302, 304, 306, and 308. As previously discussed, controller 240 can be programmed via input signals 242, 244, 246, 248, and 250 such that either Interface 1 mode signal 254 or Interface 2 mode signal 256 can be in either state, thus, selecting the test mode or the normal operation mode for each interface independently. Thus, all boundary scan cells can operate in the normal operation mode or in the test mode. Additionally, boundary scan cells 302 and 304 can operate in a test mode while boundary scan cells 306 and 308 can operate in a normal operation mode (shown in FIG. 6). Finally, boundary scan cells 302 and 304 can operate in a normal operation mode while boundary scan cells 306 and 308 be operate in a test mode. As previously discussed, it is understood that while only two boundary scan cells (302, 304 or 306, 308) are shown for a particular interface, any number of boundary scan cells can be included within an interface.

In accordance with the present invention, the association of a mode signal with a boundary scan cell is only necessary with respect to boundary scan cells associated with output signals of an integrated circuit. The output signals of an integrated circuit are provided to input pins of another integrated circuit via an interface. The method in which a boundary scan cell is associated with an input pin is not changed from the IEEE Standard 1149.1b.

The present invention segments the boundary scan ring into sections corresponding to input and output pins for each separable interface of an integrated circuit. The present invention also provides control to enable each separate interface to be selected for output from the boundary scan ring. All boundary scan cells in the example embodiment remain on the boundary scan ring, whether enabled for output or not. However, another embodiment may choose to exclude the cells not selected for output. Interfaces which are not included on the active boundary scan ring, such as the interfaces associated with boundary scan cells 306 and 308 of FIG. 6, continue in normal operation. However, those interfaces which are included on the active boundary scan ring, such as the interfaces associated with boundary scan cells 302 and 304 of FIG. 6, are in test mode operation. Therefore, each separable interface, which includes one or more boundary scan cells, can be individually tested using the IEEE Standard 1149.1b standard method while the remainder of the integrated circuit can be utilized for its normal function in the overall digital system.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of testing at least one interface of a digital integrated circuit while at least one other interface of the digital integrated circuit operates in a normal operation mode, each interface having at least one boundary scan cell, each boundary scan cell electrically coupled to a pin of the digital integrated circuit, the method comprising:

selectively categorizing at least one interface into a test mode category;

selectively categorizing at least one other interface into a normal operation mode category;

providing a first mode signal to the interfaces categorized into the test mode category such that the interfaces categorized into the test mode category operate in a test mode; and providing a second mode signal to the interfaces categorized into the normal operation mode category such that the interfaces categorized into the normal operation mode category operate in the normal operation mode.

2. The method of claim 1, wherein the steps of providing a first mode signal and providing a second mode signal further comprise:

providing a test mode signal to the interfaces categorized into the test mode category such that the interfaces categorized into the test mode category operate in a test mode; and providing a normal operation mode signal to the interfaces categorized into the normal operation mode category such that the interfaces categorized into the normal operation mode category operate in the normal operation mode.

3. The method of claim 1, wherein the steps of selectively categorizing the first and second interfaces further comprises:

programming a controller to categorize a particular interface into one of the test mode category or normal operation mode category.

4. The method of claim 3, wherein the step of programming a controller further comprises:

programming a Test Access Port to categorize a particular interface into one of the test mode category or normal operation mode category.

5. The method of claim 1, wherein the step of selectively categorizing at least one interface into a test mode category further comprises:

categorizing each boundary scan cell of the at least one interface into a test mode category.

6. The method of claim 1, wherein the step of selectively categorizing the at least one other interface into a normal operation mode category further comprises:

categorizing each boundary scan cell of the at least one other interface into a normal operation mode category.

7. The method of claim 1, wherein the step of providing a first mode signal further comprises:

providing the first mode signal to the interfaces categorized into the test mode category such that a first subset of the boundary scan cells within the interfaces categorized into the test mode category associated with an output pin of the digital integrated circuit provides a test output signal.

8. The method of claim 1, and further comprising:

providing a boundary scan signal to each boundary scan cell.

9. A system for testing at least one interface of a digital integrated circuit categorized into a test mode category while at least one other interface of the digital integrated circuit categorized into a normal operation mode category operates in a normal operation mode, the system comprising:

a plurality of boundary scan cells, each boundary scan cell electrically coupled to a pin of the digital integrated circuit, wherein each interface includes at least one boundary scan cell;

a controller electrically coupled to each interface, the controller capable of providing either a test mode signal or a normal mode signal to each interface such that the boundary scan cells of the at least one interface operate in a test mode and the boundary scan cells of the at least one other interface operate in a normal operation mode; and a programmable input signal electrically supplied to the controller for selecting the interfaces included in the at least one interface and for selecting the interfaces included in the at least one other interface.

10. The system of claim 9, wherein the controller further comprises:

a Test Access Port having a plurality of programmable inputs and a plurality of outputs.

11. The system of claim 10, and further comprising:

a second controller within each particular boundary scan cell capable of receiving data a signal from logic within the digital integrated circuit and capable of receiving the test mode signal or normal operating mode signal, and capable of outputting a desired signal based upon the received mode signal.

12. A system for testing at least one interface of a digital integrated circuit while at least one other interface of the digital integrated circuit operates in a normal operation mode, the system comprising:

a controller having a test mode output signal electrically supplied to boundary scan cells within the at least one interface such that the boundary scan cells within the at least one interface operate in a test mode, and having a normal operation mode output signal electrically supplied to boundary scan cells within the at least one other interface such that the boundary scan cells within the at least one other interface operate in the normal operation mode.

13. The system of claim 12, wherein the controller further comprises:

a Test Access Port having a plurality of programmable inputs and a plurality of outputs.

14. The system of claim 12, and further comprising:

a programmable input signal electrically supplied to the controller for selecting the interfaces included in the at least one interface and for selecting the interfaces included in the at least one other interface.

15. The system of claim 12, and further comprising:

a second controller within each particular boundary scan cell capable of receiving a data signal from logic within the digital integrated circuit and capable of receiving the test mode signal or normal operation mode signal, and for outputting a desired signal based upon the received mode signal.

* * * * *